(12) United States Patent
Wills et al.

(10) Patent No.: US 12,283,460 B2
(45) Date of Patent: Apr. 22, 2025

(54) CLOSED LOOP FARADAY CORRECTION OF A HORIZONTAL BEAM CURRENT PROFILE FOR UNIFORM CURRENT TUNING

(71) Applicant: Applied Materials, Inc., Santa Clara, CA (US)

(72) Inventors: Tyler Wills, Marblehead, MA (US); Richard Allen Sprenkle, South Hamilton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 400 days.

(21) Appl. No.: 17/897,719

(22) Filed: Aug. 29, 2022

(65) Prior Publication Data

US 2024/0071719 A1 Feb. 29, 2024

(51) Int. Cl.
*H01J 37/317* (2006.01)
*H01J 37/304* (2006.01)

(52) U.S. Cl.
CPC ........ *H01J 37/3171* (2013.01); *H01J 37/304* (2013.01); *H01J 2237/24405* (2013.01); *H01J 2237/24564* (2013.01); *H01J 2237/30483* (2013.01)

(58) Field of Classification Search
None
See application file for complete search history.

(56) References Cited

U.S. PATENT DOCUMENTS

| | | | |
|---|---|---|---|
| 6,323,497 B1* | 11/2001 | Walther | H01J 37/304 250/492.1 |
| 6,797,967 B1 | 9/2004 | Tse et al. | |
| 7,663,125 B2* | 2/2010 | Callahan | H01J 37/3171 250/492.23 |
| 8,835,882 B2* | 9/2014 | Lin | H01J 37/244 250/397 |
| 8,933,424 B1* | 1/2015 | Satoh | H01J 37/3171 118/712 |

(Continued)

FOREIGN PATENT DOCUMENTS

TW 200525576 A 8/2005

OTHER PUBLICATIONS

International Search Report and Written Opinion mailed Nov. 22, 2023 in corresponding PCT application No. PCT/US2023/028857.

*Primary Examiner* — David E Smith
*Assistant Examiner* — Alina Kaliszewski
(74) *Attorney, Agent, or Firm* — Nields, Lemack & Frame, LLC (57) ABSTRACT

A system and method for creating a beam current profile that eliminates variations that are not position dependent is disclosed. The system includes two Faraday sensors; one which is moved across the ion beam and a second that remains at or near a certain location. The reference Faraday sensor is used to measure temporal variations in the beam current, while the movable Faraday sensor measures both the position dependent variations and the temporal variations. By combining these measurements, the actual position dependent variations of the scanned ion beam can be determined. This resultant beam current profile can then be used to control the scan speed of the electrostatic or magnetic scanner.

19 Claims, 4 Drawing Sheets

(56) References Cited

U.S. PATENT DOCUMENTS

| | | | | |
|---|---|---|---|---|
| 2005/0017202 A1* | 1/2005 | White | ............... | H01J 37/1471 |
| | | | | 250/492.21 |
| 2005/0189500 A1* | 9/2005 | Graf | ............... | H01J 37/304 |
| | | | | 250/492.21 |
| 2007/0114455 A1 | 5/2007 | Naito et al. | | |
| 2009/0242808 A1* | 10/2009 | Evans | ............... | H01J 37/304 |
| | | | | 250/492.21 |
| 2012/0248324 A1* | 10/2012 | Eisner | ............... | H01J 3/14 |
| | | | | 250/492.21 |
| 2018/0068829 A1 | 3/2018 | Ishibashi et al. | | |
| 2021/0305011 A1* | 9/2021 | Sinclair | ............... | H01J 37/244 |
| 2023/0140499 A1* | 5/2023 | Ishibashi | ............... | H01J 37/304 |
| | | | | 250/492.21 |

* cited by examiner

CLOSED LOOP FARADAY CORRECTION OF A HORIZONTAL BEAM CURRENT PROFILE FOR UNIFORM CURRENT TUNING

FIELD

Embodiments of the present disclosure relate to a system and method for measuring the current profile of an ion beam and correcting for temporal variations.

BACKGROUND

Ion implantation is a common technique to introduce impurities into a workpiece to affect the conductivity of portions of that workpiece. For example, ions that contain elements in Group III, such as boron, aluminum and gallium, may be used to create P-type regions in a silicon workpiece. Ions that contain elements in Group V, such as phosphorus and arsenic, may be used to create N-type regions in the silicon workpiece.

In some systems, a spot ion beam is scanned across the workpiece to implant the ions. The scan speed may determine the amount of ions that each portion of the workpiece receives. For example, at higher scan speeds, the beam current of an area is reduced, since the ion beam spends less time over this area. Lower scan speeds allow more ions to be implanted in an area.

Ideally, the scan speed of the ion beam would be uniform. However, there are position dependent variations that exist. For example, the beam current may be lower at the ends of the workpiece than at the middle of that workpiece. To compensate for this, the scanner may move at a slower speed near the ends of the workpiece. Therefore, in some embodiments, the beam current is profiled to generate data, which may be in the form of a graph or table, showing the beam current as a function of position. This data can then be used to adjust the scan speed to supply uniform current across the entire workpiece.

However, in addition to position dependent variation, there may be variations that occur during this profiling that are non-repeatable. If these non-repeatable variations are used to adjust the scan speed, the final result may not be optimal.

Therefore, it would be advantageous if there were a system and method that created a beam current profile that included only the position dependent variations and used the beam current profile to adjust the speed of the scanner.

SUMMARY

A system and method for creating a beam current profile that eliminates variations that are not position dependent is disclosed. The system includes two Faraday sensors; one which is moved across the ion beam and a second that remains at or near a certain location. The reference Faraday sensor is used to measure temporal variations in the beam current, while the movable Faraday sensor measures both the position dependent variations and the temporal variations. By combining these measurements, the actual position dependent variations of the scanned ion beam can be determined. This resultant beam current profile can then be used to control the scan speed of the electrostatic or magnetic scanner.

According to one embodiment, an ion implantation system is disclosed. The ion implantation system comprises an ion source from which a spot beam is extracted; a scanner which scans the spot beam in a first direction to create diverging ion trajectory paths; an angle corrector to alter the diverging ion trajectory paths into substantially parallel paths of a scanned ion beam; a movable current measuring device which travels in the first direction and measures current as a function of position in the first direction, referred to as movable position current measurements and wherein the movable position current measurements comprise position dependent variations and temporal variations; a reference current measuring device used to create reference position current measurements that comprise temporal variations; and a controller, wherein the controller uses the movable position current measurements and the reference position current measurements to create a corrected beam current profile. In some embodiments, a speed at which the scanner scans the spot beam is determined by a scan speed profile, and the controller uses the corrected beam current profile to generate the scan speed profile used by the scanner. In some embodiments, the corrected beam current profile is generated by subtracting the reference position current measurements from movable the position current measurements for all positions in the first direction. In some embodiments, the corrected beam current profile is generated by normalizing the reference position current measurements and the movable position current measurements and using normalized values to generate the corrected beam current profile. In some embodiments, the controller calculates an average of the reference position current measurements and subtracts the average from each of the reference position current measurements to create a beam current profile that comprises temporal variations. In some embodiments, the corrected beam current profile is generated by subtracting the beam current profile that comprises temporal variations from the movable position current measurements for all positions in the first direction. In certain embodiments, the movable current measuring device is a Faraday sensor. In some embodiments, the reference current measuring device is a Faraday sensor. In some embodiments, the scanned ion beam is wider than a width of a workpiece to be implanted, and the reference current measuring device is disposed in a path of the scanned ion beam, outside a portion of the scanned ion beam that impacts the workpiece. In some embodiments, the reference current measuring device is disposed in a fixed position while the movable current measuring device travels across the scanned ion beam in the first direction. In some embodiments, temporal variations in the corrected beam current profile are reduced by at least 90% as compared to a beam current profile generated using only the movable position current measurements.

According to another embodiment, a method of tuning an ion beam to achieve a target uniformity is disclosed. The method comprises scanning the ion beam in a first direction at a constant scan speed profile to create a scanned ion beam, wherein the scanned ion beam has position dependent variations and temporal variations; measuring current of the scanned ion beam using two current measuring devices, wherein a first one of the two current measuring devices is a movable current measuring device that moves across the ion beam in the first direction; combining current measurements from the two current measuring devices to create a corrected beam current profile, wherein temporal variations have been reduced as compared to a beam current profile derived using only the movable current measuring device; and comparing a uniformity of the corrected beam current profile to the target uniformity, and if the uniformity is not better than the target uniformity, inputting the corrected beam current profile to a tuning algorithm, wherein the tuning algorithm generates a new scan speed profile based on the corrected beam current profile. In some embodiments, the scanning, measuring, using, comparing and inputting are repeated until the uniformity is better than the target uniformity. In some embodiments, measurements from the two current measuring devices are normalized prior to being combined to create the corrected beam current profile. In some embodiments, a second one of the two current measuring devices remains stationary during the measuring. In certain embodiments, measurements from the first one of the two current measuring devices are referred to as movable position current measurements, measurements from a second one of the two current measuring devices are referred to as reference position current measurements, and the combining comprises: normalizing the reference position current measurements and the movable position current measurements; and using normalized values to create the corrected beam current profile. In certain embodiments, measurements from the first one of the two current measuring devices are referred to as movable position current measurements, measurements from a second one of the two current measuring devices are referred to as reference position current measurements, and the combining comprises: calculating an average of the reference position current measurements; and subtracting the average from each of the reference position current measurements to create a beam current profile that comprises temporal variations. In some further embodiments, the combining further comprises subtracting the beam profile current that comprises temporal variations from the movable position current measurements for all positions in the first direction. In some further embodiments, the combining further comprises normalizing the beam current profile that comprises temporal variations and the movable position current measurements prior to the subtracting.

BRIEF DESCRIPTION OF THE FIGURES

For a better understanding of the present disclosure, reference is made to the accompanying drawings, which are incorporated herein by reference and in which.

DETAILED DESCRIPTION

Figure 1A:
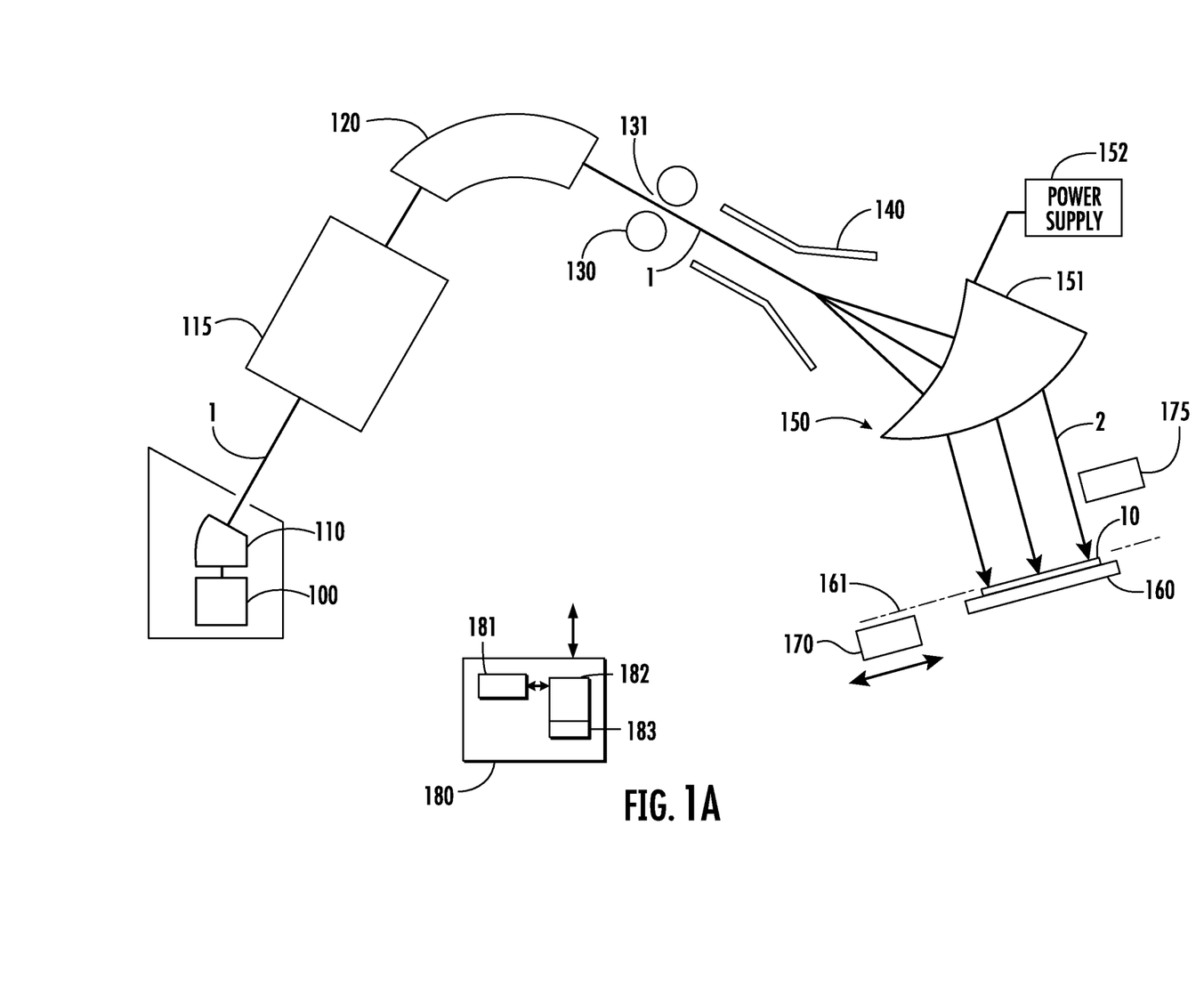
FIG. 1A is an ion implanter that utilizes a spot beam according to one embodiment.
Figure 1B:
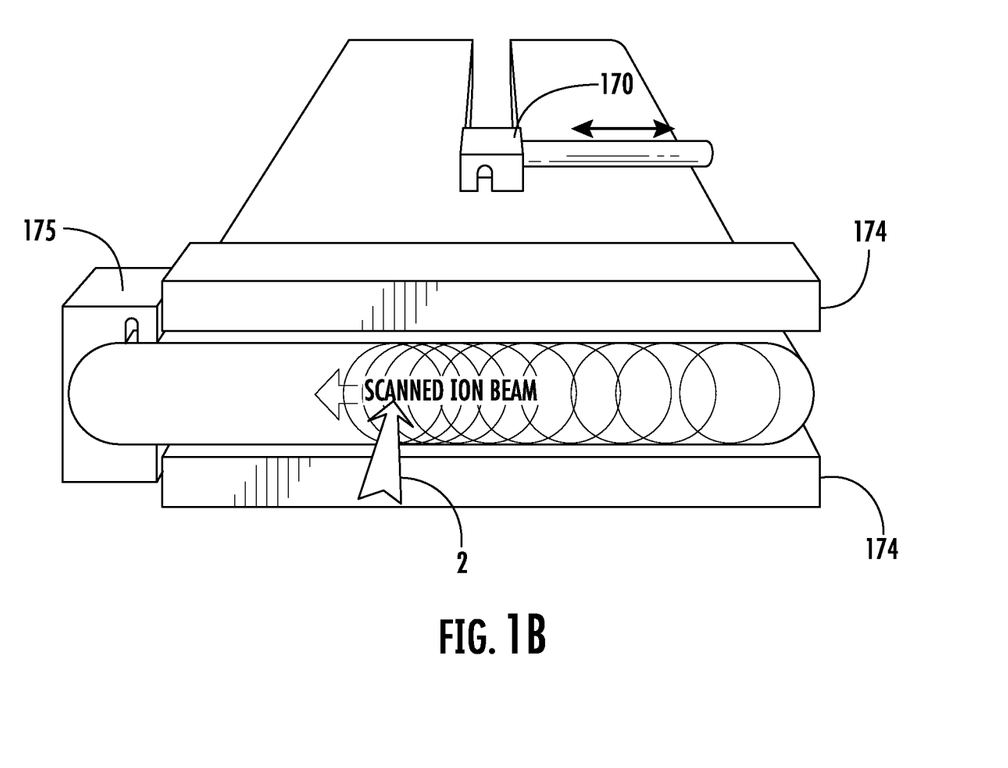
FIG. 1B shows the position of the current measuring devices as view in the direction of the scanned ion beam.

FIG. 1A shows a spot beam ion implantation system that may be used for implanting ions into a workpiece using a spot beam according to one embodiment. FIG. 1B shows a view of the current measuring devices as viewed in the direction of the scanned ion beam.

The spot beam ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped.

Disposed outside and proximate the extraction aperture of the ion source 100 is a source filter 110.

Located downstream from the source filter 110 is a mass analyzer 120. An acceleration/deceleration column 115 is positioned between source filter 110 and mass analyzer 120. The mass analyzer 120 uses magnetic fields to guide the path of the extracted ions 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system. The ions that pass through the mass resolving device 130 may form a spot beam.

The spot beam may then enter a scanner 140 which is disposed downstream from the mass resolving device 130. The scanner 140 causes the spot beam to be fanned out into a plurality of divergent ion beamlets. In other words, the scanner 140 creates diverging ion trajectory paths. The scanner 140 may be electrostatic or magnetic. The scanner 140 may comprise spaced-apart scan plates connected to a scan generator. The scan generator applies a scan voltage waveform, such as a sawtooth waveform, for scanning the ion beam in accordance with the electric field between the scan plates. Angle corrector 150 is designed to deflect ions in the scanned ion beam to produce scanned ion beam 2 having parallel ion trajectories, thus focusing the scanned ion beam. Specifically, the angle corrector 150 is used to alter the diverging ion trajectory paths into substantially parallel paths of a scanned ion beam 2. In particular, angle corrector 150 may comprise magnetic pole pieces 151 which are spaced apart to define a gap and a magnet coil (not shown) which is coupled to a power supply 152. The scanned ion beam 2 passes through the gap between the magnetic pole pieces 151 and is deflected in accordance with the magnetic field in the gap. The magnetic field may be adjusted by varying the current through the magnet coil. Beam scanning and beam focusing are performed in a selected plane, such as a horizontal plane.

The workpiece 10 is disposed on a movable workpiece holder 160.

In certain embodiments, the forward direction of the ion beam is referred to as the Z-direction, the direction perpendicular to this direction and horizontal may be referred to as the first direction or the X-direction, while the direction perpendicular to the Z-direction and vertical may be referred to as the second direction or the Y-direction. In this example, it is assumed that the scanner 140 scans the spot beam in the first direction while the movable workpiece holder 160 is translated in the second direction. The rate at which the scanner 140 scans the spot beam in the first direction may be referred to as beam scan speed or simply scan speed.

Thus, in operation, the movable workpiece holder 160 moves in the second direction from a first position, which may be above the scanned ion beam 2 to a second position, which may be below the scanned ion beam 2. The movable workpiece holder 160 then moves from the second position back to the first position. During this time, the spot beam is being scanned in the first direction, ensuring that the entirety of the workpiece 10 is exposed to the spot beam.

A movable current measuring device 170 is positioned proximate the movable workpiece holder 160. In certain embodiments, as shown in FIG. 1A, the movable current measuring device 170 may be positioned in the plane 161 of the movable workpiece holder 160 so that it measures the actual beam current that impacts the workpiece 10. In some embodiments, the movable workpiece holder 160 is moved to a position out of the path of the scanned ion beam 2 while the movable current measuring device 170 traverses the plane 161 of the movable workpiece holder 160. The movable current measuring device 170 may be a Faraday sensor or other suitable sensor. The movable current measuring device 170 is configured to move in the first direction across the scanned ion beam 2. This movable current measuring device 170 may also be referred to as the profiler Faraday sensor.

A reference current measuring device 175 may also be positioned in the path of the scanned ion beam 2. Unlike the movable current measuring device 170, this device remains in or near one position while measurements are being taken. In some embodiments, the reference current measuring device 175 is stationary during the measurement process. In some embodiments, the reference current measuring device 175 is located in the same plane as the movable current measuring device 170. In other embodiments, it may be located in a different location. In certain embodiments, the scanned ion beam 2 may be wider than the workpiece 10. The reference current measuring device 175 may be disposed in the path of the scanned ion beam 2, but outside the region in which the workpiece 10 is disposed. In this way, the movable current measuring device 170 is able to move across the entire width of the workpiece without interference with the reference current measuring device 175. FIG. 1B also shows apertures 174 that are used to limit the width of the scanned ion beam 2 in the second or Y direction.

A controller 180 is also used to control the system. The controller 180 has a processing unit 181 and an associated memory device 182. This memory device 182 contains the instructions 183, which, when executed by the processing unit, enable the system to perform the functions described herein. This memory device 182 may be any non-transitory storage medium, including a non-volatile memory, such as a FLASH ROM, an electrically erasable ROM or other suitable devices. In other embodiments, the memory device 182 may be a volatile memory, such as a RAM or DRAM. In certain embodiments, the controller 180 may be a general purpose computer, an embedded processor, or a specially designed microcontroller. The actual implementation of the controller 180 is not limited by this disclosure. The controller 180 may be in communication with the scanner 140, the movable current measuring device 170 and the reference current measuring device 175 and may be configured to modify the scan speed of scanner 140 based on the data collected from the two current measuring devices.

During the tuning process, the movable workpiece holder 160 may be moved so that it is not in the path of the scanned ion beam 2. The ions 1 are extracted from the ion source 100 and travel along the path, ultimately creating the scanned ion beam 2. Initially, the scanner 140 may be configured by the controller 180 to utilize a constant scan speed profile.

Figure 2A:
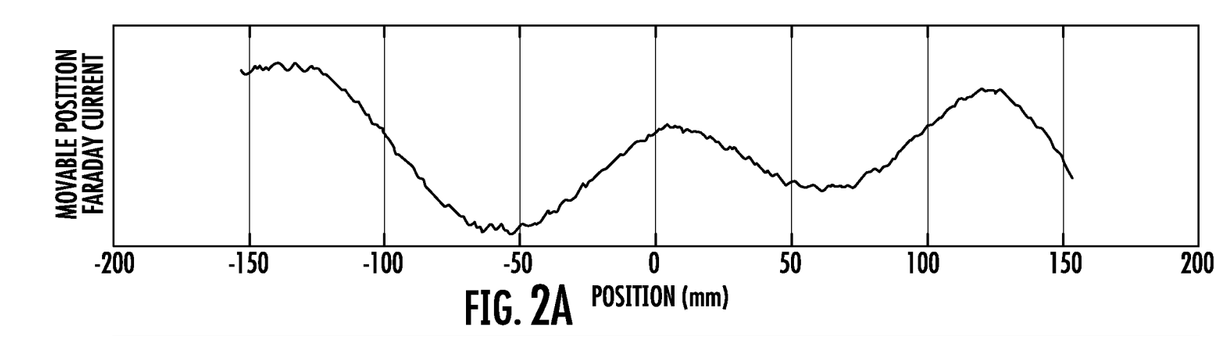
FIGS. 2A-2C show representative beam current profiles for the movable current measuring device, the reference current measuring device and the corrected beam current profile, respectively.

The movable current measuring device 170 is then moved along the first direction, measuring the collected beam current as a function of position in the first direction. In some embodiments, the movable current measuring device 170 may move at a speed of between 1 and 320 mm/sec. This action by the movable current measuring device 170 allows the generation of data that correlates beam current with workpiece position in the first direction. FIG. 2A shows one such set of data, represented as a graph. Note that this graph is merely illustrative of the data collected by the movable current measuring device 170 and other formats may be generated. The horizontal axis represents the position on the workpiece, where the center of the workpiece is denoted as 0 mm and distances are measured from this point in each direction. Note that in FIG. 2A, there are areas where the beam current reaches a local maximum, such as at −140 mm, 0 mm, and 120 mm. Additionally, there are areas where the beam current reaches a local minimum, such as at −60 mm.

While the movable current measuring device 170 is being moved along the first direction, the reference current measuring device is also being used to measure the beam current. Although the reference current measuring device 175 is not moving, the measurements taken are correlated to the position of the movable current measuring device 170. A graph shown this can be seen in FIG. 2B. Note that the horizontal axis represents the position of the movable current measuring device 170 at the time that the current measurement was taken by the reference current measuring device 175. Again, note that this graph is merely illustrative of the data collected by the reference current measuring device 175 and other formats may be generated. Note that, for purposes of illustration, it is assumed that there is a sinusoidal variation in the scanned ion beam 2. Since the reference current measuring device 175 remains in one location, this variation is a temporal variation and as such, is not repeatable.

The data collected by the reference current measuring device 175 is indicative of the current at the specific position where it is located, as well of the temporal variations in that current. Thus, if the current collected by the reference current measuring device 175 as the movable current measuring device 170 moves across the entire first direction is averaged, the result would be indicative of the current at the specific position where it is located, as well as the average temporal variation. In other words, the each current measured by the reference current measuring device 175 can be expressed as a position dependent current, taken at position x, where x is the location of the reference current measuring device in the first direction, and a temporal variation that is based on time. Likewise, the average current measured by the reference current measuring device 175 can be expressed as the position dependent current, taken at position x, and the average temporal variation across the scan. Thus, when the average current measured by the reference current measuring device 175 is subtracted from each individual current measurement, the resultant beam current profile includes the time variation. In some embodiments, the position dependent variation is completely removed.

Thus, the reference current measuring device 175 collects data at a plurality of times, when the movable current measuring device 170 is at a plurality of different positions. This plurality of data points collected by the reference current measuring device 175 is referred to as reference position current measurements, and may be referred to as RC(x). The average value of the current collected by the reference current measuring device 175 during a scan, $\overline{RC}$, is then subtracted from each reference position current measurement to yield results that only vary with time. These results are referred to as the adjusted reference position current measurements, or ARC(x) wherein ARC(x)=RC(x)−$\overline{RC}$. In other words, the difference between the reference position current measurements and the adjusted reference position current measurements is a constant offset, where that constant offset is the average of all of the reference position current measurements.

By subtracting this temporal variation (i.e. the adjusted reference position current measurements) from the data collected by the movable current measuring device 170, a more accurate representation of the relationship between beam current and X position may be developed. FIG. 2C shows a graph where the temporal variations, detected using the reference current measuring device 175 have been removed from the graph shown in FIG. 2A.

In one embodiment, the data collected by the reference current measuring device 175 is simply subtracted from the data collected by the movable current measuring device. In other words, for each position in the first direction, the reference position current measurements are subtracted from the data collected by the movable current measuring device (MC). This will remove the temporal variations; however, all results will be offset by the position dependent current observed by the reference current measuring device 175. In this embodiment, the corrected current (CC) may be defined as CC(x)=MC(x)−RC(x).

Alternatively, the reference position current measurements computed based on data collected by the reference current measuring device 175, referred to as adjusted reference position current measurements or ARC(x) where x is the X position of the movable current measuring device 170 in the first direction at the time of the measurement, may be subtracted from the data collected by the movable current measuring device 170. Specifically, the data collected by the movable current measuring device 170 may be referred to as movable position current measurements or MC(x). Thus, in one embodiment, the corrected current (CC) may be defined as CC(x)=MC(x)−ARC(x) for all x in the range of the scanner 140.

In another embodiment, the gain or location of the current measuring devices may be such that the currents measured by each current measuring devices are not the same scale. For example, if the reference current measuring device 175 is further upstream (toward the scanner 140 and further from the workpiece 10) than the movable current measuring device 170, it may collect more current than the movable current measuring device 170. In this embodiment, it may be beneficial to normalize the measurements from the two different current measuring devices. For example, the data from the reference current measuring device 175 may be normalized to represent a change from the mean. Specifically, the normalized temporal change (ANormRC) as a function of X position in the first direction may be expressed as:

$$\Delta NormRC(x) = \frac{RC(x) - \overline{RC}}{\overline{RC}},$$

where $\overline{RC}$ the arithmetic mean of the reference current measurements taken for all values of X and RC(x) is the reference position current measurement taken when the movable current measuring device is at position x in the first direction. Note that by subtracting the arithmetic mean, the numerator represents only the time variations of the scanned ion beam 2.

This value can be combined with the value collected by the movable current measuring device 170 as follows:

CorrectedCurrent(x)=MC(x)−$\overline{MC}$*ANormRC(x), where $\overline{MC}$ is the arithmetic mean of the movable current measurements for all values of X.

Of course, these calculations may be performed differently. For example, the following sequence of operations may be performed, which result in the same equations:

$$NormRC(x) = \frac{RC(x)}{\overline{RC}};$$

$$NormMC(x) = \frac{MC(x)}{\overline{MC}};$$

Corrected Current $(x) = (NormMC(x) - NormRC(x) + 1) * \overline{MC}$

Figure 2B:
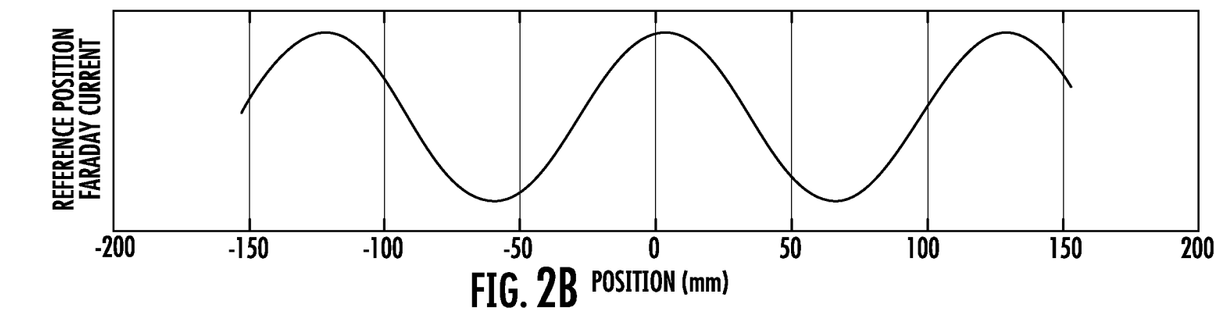
Figure 2C:
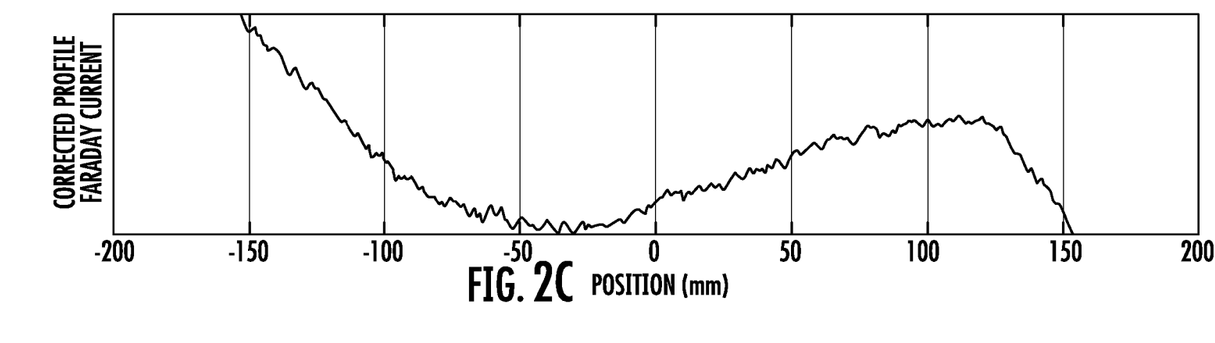

FIG. 2C shows the corrected current profile, as a function of X, where the temporal variation shown in FIG. 2B is removed from the current profile collected by the movable current measuring device 170. This corrected current profile can then be used to adjust the scan speed of the scanner 140.

Stated differently, the movable current measuring device 170 collects data that includes both position dependent information and non-repeatable time dependent information. Specifically, there are position dependent variations and temporal variations. In contrast, the reference current measuring device 175 collects data that includes position dependent variation from only one position (which can be subtracted out) and non-repeatable time dependent information, also known as temporal variations. By removing the non-repeatable time dependent information from the data collected from the movable current measuring device 170, a corrected current profile, which includes only the position dependent information, can be created.

It is noted that the above description indicates that the reference current measuring device 175 may be disposed at a fixed location. However, other embodiments are also possible. For example, small variations in the first direction may not affect the position dependent component of the measurement. For example, movements of less than 5 mm in the positive or negative X direction may not adversely affect the accuracy of the reference measurements.

Figure 3:
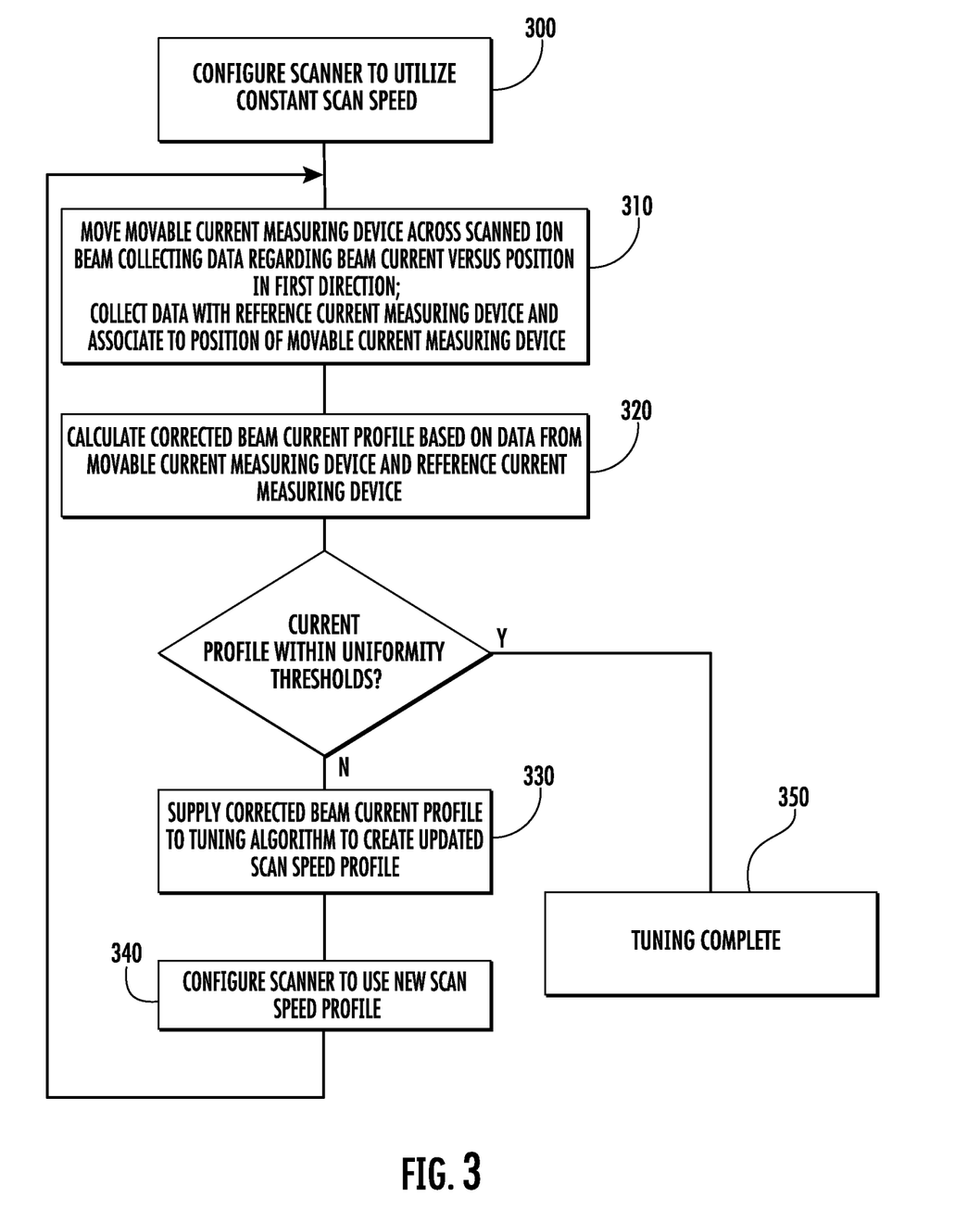
FIG. 3 shows the operation of the controller during the tuning process according to one embodiment.

FIG. 3 shows the operation of the controller 180 during the tuning process. First, as shown in Box 300, the scanner 140 is configured to utilize a uniform scan speed. The movable current measuring device 170 is then moved in the first direction across the scanned ion beam 2, collecting data regarding the amount of beam as a function of position in the first direction, as shown in Box 310. As noted above, this data may be referred to as movable position current data. At the same time, the reference current measuring device 175 measures the current a plurality of times and associates each current measurement with the X position of the movable current measuring device 170 in the first direction. This data may be referred to as reference position current data and comprises the RC(x) functions described above. As explained above, the average current measured by the reference current measuring device 175 $\overline{(RC)}$ may be subtracted from the reference position current data to yield the adjusted reference position current data.

Next, the corrected beam current profile is created based on the data collected from the movable current measuring device 170 and the reference current measuring device 175, as described above and shown in Box 320. This may involve simply subtracting the temporal variation obtained using the reference current measuring device 175 from the data from the movable current measuring device 170 or by creating normalized values and performing the transformation using these normalized values. In some embodiments, the temporal variations have been eliminated from the corrected beam current profile. In other embodiments, the temporal variations have been significantly reduced in the corrected beam current profile. In other words, the corrected beam current profile has reduced temporal variation, as compared to the beam current profile generated using only the movable current measuring device 170. In some embodiments, more than 90% of the temporal variations have been removed from the corrected beam current profile, as compared to the beam current profile generated using only the movable current measuring device 170.

Next, this corrected beam current profile is analyzed to determine if it meets the uniformity limits. For example, it may be desirous to have the uniformity to be within 0.5% across the width of the scanned ion beam 2. In this disclosure, uniformity is defined as the standard deviation of the scanned ion beam profile divided by the mean value of the scanned ion beam profile, multiplied by 100%. If the uniformity thresholds are met, the tuning process is complete, as shown in Box 350.

If the uniformity thresholds are not met, this corrected beam current profile is then supplied to a tuning algorithm to adjust the scan speed profile, as shown in Box 330.

The tuning algorithm may be a PID (proportional-integral and derivative) controller, which utilizes the corrected beam current profile to calculate the scan speed profile. The scan speed profile represents the scan speed of the scanner 140 as a function of the first direction. As an example, FIG. 2C shows the corrected beam current profile that may be supplied to the tuning algorithm. In response, the tuning algorithm may create an updated scan speed profile. The scan profile may be similar to the beam current profile in that in areas with high beam current, the scan speed is increased. Conversely, in areas with low beam current, the scan speed is decreased. The actual implementation of the tuning algorithm is not limited by this disclosure and those skilled in the art may implement the tuning algorithm in other ways. For example, PI or PD controllers may be utilized.

Next, as shown in Box 340, the updated scan speed profile, as determined by the tuning algorithm, is supplied to the scanner 140. The sequence shown in Boxes 310-350 is then repeated until either the uniformity thresholds are met, or the number of iterations has been exhausted.

The embodiments described above in the present application may have many advantages. First, the corrected beam current profile contains only variations that are position dependent. These variations are expected to be more constant and repeatable. Consequently, the number of iterations to find a scan speed profile that meets the uniformity thresholds may be reduced. This is especially true for ion implantation systems with unstable ion sources.

Further, the repeatability of the implantation system may be improved since the tuning algorithm is not trying to correct for unrepeatable variations.

Finally, there is no downside to implementing this method in ion implantation systems that have no temporal variations. In this case, the current measured by reference current measuring device 175 will be relatively uniform throughout the width of the scanned ion beam 2. Consequently, there will be little correction applied to the beam current profile obtained by the movable current measuring device 170.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
   an ion source from which a spot beam is extracted;
   a scanner which scans the spot beam in a first direction to create diverging ion trajectory paths;
   an angle corrector to alter the diverging ion trajectory paths into substantially parallel paths of a scanned ion beam;
   a movable current measuring device which travels in the first direction and measures current as a function of position in the first direction, referred to as movable position current measurements and wherein the movable position current measurements comprise position dependent variations and temporal variations;
   a reference current measuring device used to create reference position current measurements that comprise temporal variations; and
   a controller, wherein the controller uses the movable position current measurements and the reference position current measurements to create a corrected beam current profile, wherein the reference position current measurements are used to create a beam current profile having temporal variations, and the corrected beam current profile is generated by subtracting the beam current profile having temporal variations from the movable position current measurements for all positions in the first direction.

2. The ion implantation system of claim 1, wherein a speed at which the scanner scans the spot beam is determined by a scan speed profile, and wherein the controller uses the corrected beam current profile to generate the scan speed profile used by the scanner.

3. The ion implantation system of claim 1, wherein the beam current profile having temporal variations is defined as the reference position current measurements for all positions in the first direction.

4. The ion implantation system of claim 1, wherein the corrected beam current profile is generated by normalizing the reference position current measurements and the movable position current measurements and using normalized values to generate the corrected beam current profile.

5. The ion implantation system of claim 1, wherein the controller calculates an average of the reference position current measurements and subtracts the average from each of the reference position current measurements to create the beam current profile having temporal variations.

6. The ion implantation system of claim 1, wherein the beam current profile having temporal variations is created by calculating an average of the reference position current measurements, subtracting the average from each of the reference position current measurements, dividing that result by the average of the reference position current measurements, and multiplying that result by an average of all movable position current measurements.

7. The ion implantation system of claim 1, wherein the movable current measuring device is a Faraday sensor.

8. The ion implantation system of claim 1, wherein the reference current measuring device is a Faraday sensor.

9. The ion implantation system of claim 1, wherein the scanned ion beam is wider than a width of a workpiece to be implanted, and the reference current measuring device is disposed in a path of the scanned ion beam, outside a portion of the scanned ion beam that impacts the workpiece.

10. The ion implantation system of claim 1, wherein the reference current measuring device is disposed in a fixed position while the movable current measuring device travels across the scanned ion beam in the first direction.

11. The ion implantation system of claim 1, wherein temporal variations in the corrected beam current profile are reduced by at least 90% as compared to a beam current profile generated using only the movable position current measurements.

12. A method of tuning an ion beam to achieve a target uniformity, comprising:
scanning the ion beam in a first direction at a constant scan speed profile to create a scanned ion beam, wherein the scanned ion beam has position dependent variations and temporal variations;
measuring current of the scanned ion beam using two current measuring devices, wherein a first one of the two current measuring devices is a movable current measuring device that moves across the ion beam in the first direction, wherein measurements from the first one of the two current measuring devices are referred to as movable position current measurements, measurements from a second one of the two current measuring devices are referred to as reference position current measurements, and wherein the reference position current measurements are used to create a beam current profile having temporal variations;
subtracting the beam current profile having temporal variations from the movable position current measurements for all positions in the first direction to create a corrected beam current profile, wherein temporal variations have been reduced as compared to a beam current profile derived using only the movable current measuring device; and
comparing a uniformity of the corrected beam current profile to the target uniformity, and if the uniformity is not better than the target uniformity,
inputting the corrected beam current profile to a tuning algorithm, wherein the tuning algorithm generates a new scan speed profile based on the corrected beam current profile.

13. The method of claim 12, wherein the scanning, measuring, using, comparing and inputting are repeated until the uniformity is better than the target uniformity.

14. The method of claim 12, wherein measurements from the two current measuring devices are normalized prior to being combined to create the corrected beam current profile.

15. The method of claim 12, wherein the second one of the two current measuring devices remains stationary during the measuring.

16. The method of claim 12, wherein the corrected beam current profile is generated by
normalizing the reference position current measurements and the movable position current measurements; and
using normalized values to create the corrected beam current profile.

17. The method of claim 12, the beam current profile having temporal variations is created by:
calculating an average of the reference position current measurements; and
subtracting the average from each of the reference position current measurements to create the beam current profile having temporal variations.

18. The method of claim 12, wherein the beam current profile having temporal variations is created by calculating an average of the reference position current measurements, subtracting the average from each of the reference position current measurements, dividing that result by the average of the reference position current measurements, and multiplying that result by an average of all movable position current measurements.

19. The method of claim 12, wherein the beam profile having temporal variations is defined as the reference position current measurements for all positions in the first direction.

* * * * *